United States Patent
Crozier et al.

(10) Patent No.: US 6,259,268 B1
(45) Date of Patent: Jul. 10, 2001

(54) VOLTAGE STRESS TESTABLE EMBEDDED DUAL CAPACITOR STRUCTURE AND PROCESS FOR ITS TESTING

(75) Inventors: James L. Crozier, San Jose; Andrew J. Morrish, Saratoga; Muthanna D. Salman, Santa Clara, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/285,374

(22) Filed: Apr. 2, 1999

(51) Int. Cl.[7] .................................................. G01R 31/22
(52) U.S. Cl. .................... 324/768; 324/158.1; 361/762
(58) Field of Search ................................... 324/537, 760, 324/519, 765, 158.1, 663, 768; 361/762

(56) References Cited

U.S. PATENT DOCUMENTS

| | | | |
|---|---|---|---|
| 4,878,155 | * 10/1989 | Conley | 361/401 |
| 5,124,642 | * 6/1992 | Marx | 324/127 |
| 5,179,433 | 1/1993 | Misawa et al. | 257/48 |
| 5,973,929 | * 10/1999 | Arakawa et al. | 361/762 |

* cited by examiner

Primary Examiner—Safet Metjahic
Assistant Examiner—Jimmy Nguyen

(74) Attorney, Agent, or Firm—Girard & Equitz LLP

(57) ABSTRACT

A voltage stress testable embedded dual capacitor structure for use in an integrated circuit (IC). The voltage stress testable embedded dual capacitor structure includes a semiconductor substrate with an electrically insulating base layer thereon, a first embedded dual capacitor and a second embedded dual capacitor connected in series and disposed on the electrically insulating base layer, and a probe pad. The probe pad is electrically connected directly to the first and second embedded dual capacitors at a location therebetween (e.g. by being connected to an electrically conductive top plate of the second embedded dual capacitor). The voltage stress testable embedded dual capacitor structure can be voltage stress tested using an applied voltage high enough to assure the reliability of the first and second embedded dual capacitors, without exposing other electronic devices in the IC to a damaging level of voltage. Also provided is a process for voltage stress testing embedded dual capacitors. The process includes steps of first providing the voltage stress testable embedded dual capacitor structure described above, followed by voltage stress testing the first embedded dual capacitor. The voltage stress test step includes applying a first predetermined test probe voltage to the probe pad, thereby inducing a first predetermined electric field across the first embedded dual capacitor. The current flow across the first embedded capacitor resulting from that electric field is then measured. Subsequently, the second embedded dual capacitor is voltage stress tested in the same manner as the first embedded dual capacitor.

16 Claims, 3 Drawing Sheets

VOLTAGE STRESS TESTABLE EMBEDDED DUAL CAPACITOR STRUCTURE AND PROCESS FOR ITS TESTING

BACKGROUND OF THE INVENTION

1. Field of the Invention

The present invention relates to integrated circuit structures and, in particular, to voltage stress testable embedded dual capacitor structures.

2. Description of the Related Art

An integrated circuit (IC) includes numerous electronic devices, such as bipolar transistors, metal-oxide-semiconductor (MOS) transistors, diodes, resistors and capacitors. These electronic devices are interconnected by an electrically conducting path, typically a metal line. When a capacitor is incorporated in an IC and is essential to the IC's performance and function, it is often referred to as an "embedded" capacitor. For example, an IC designed to drive a cathode ray tube (CRT), commonly referred to as a "CRT driver IC," can include such electronic devices as interconnected bipolar transistors, resistors and embedded capacitors. These IC electronic devices are adapted and arranged to provide the electronic signals that control (i.e. "drive") the CRT's electron gun. The embedded capacitor of such a CRT driver IC provides for positive feedback within the IC and, hence, increases the speed of the CRT driver IC. These embedded capacitors are, therefore, distinct from isolated test capacitors, which are not incorporated in an IC. The isolated test capacitors, consequently, do not affect the IC's performance and function. Such isolated test capacitors are described in U.S. Pat. No. 5,179,433 to Misawa et al., which is hereby incorporated by reference.

After an IC is fabricated, the functionality and reliability of the entire IC and its individual interconnected electronic devices are typically tested under a variety of electrical conditions. For the case of an IC that contains an embedded capacitor, it is frequently desirable to test the reliability of the embedded capacitor by subjecting it to a voltage stress test. In such a voltage stress test, a voltage (commonly referred to as a "applied voltage") is applied to the embedded capacitor to induce a predetermined electric field therein, while a current flow across the embedded capacitor resulting from that electric field is measured. The ICs exhibiting current flows that are greater than a predetermined current limit are rejected as unreliable, while those exhibiting current flows that are less than the predetermined current limit are considered acceptable for shipment to customers, assuming these ICs pass other appropriate functionality and reliability tests.

An obstacle, however, arises during a voltage stress test, when an embedded capacitor's reliability needs to be assured using an applied voltage at a level that is high enough to damage other electronic devices in the IC. For example, when a CRT driver IC includes a conventional single embedded capacitor that requires a voltage stress test using an applied voltage of 200 volts, but the CRT driver IC also includes interconnected bipolar transistors with breakdown voltages of less than 100 volts. To avoid damage to other electronic devices in the IC (e.g. to avoid breakdown of the interconnected bipolar transistors), conventional single embedded capacitors are regularly subjected to voltage stress tests using an applied voltage that is too low to completely guarantee their reliability.

There is, therefore, still a need in the field for an embedded capacitor structure that can be voltage stress tested using a sufficiently high applied voltage to completely assure its reliability, while not subjecting other electronic devices in the IC to a damaging level of voltage. Also needed is a process for voltage stress testing embedded capacitor structures that does not subject other electronic devices in the IC to a damaging level of voltage.

SUMMARY OF THE INVENTION

A voltage stress testable embedded dual capacitor structure for use in an integrated circuit (IC) in accordance with the present invention includes a semiconductor substrate (e.g., a silicon substrate) with an electrically insulating base layer thereon, as well as a first embedded dual capacitor, a second embedded dual capacitor and a probe pad, all of which are disposed above the electrically insulating base layer. The first embedded dual capacitor and the second embedded dual capacitor are directly electrically connected to each other in series and to electronic devices in the IC. The probe pad is electrically connected directly between the first embedded dual capacitor and the second embedded dual capacitor (e.g. via an electrical connection to an electrically conductive bottom plate of the first embedded dual capacitor; and via an electrical connection to an electrically conductive top plate of the second embedded dual capacitor).

Voltage stress testable embedded dual capacitor structures in accordance with the present invention enable first and second embedded dual capacitors therein to undergo a voltage stress test using an applied voltage high enough to guarantee their reliability, without exposing other electronic devices in the IC to a damaging level of voltage. This is because, by employing two embedded capacitors (i.e. a first embedded dual capacitor and a second embedded dual capacitor) connected in series, rather than employing a conventional single embedded capacitor, the applied voltage required during a voltage stress test for each of the embedded dual capacitors is reduced. If, for example, the first and second embedded dual capacitors have equal capacitance values (e.g. equal capacitor areas, identical dielectric material and equal dielectric material layer thicknesses) and are connected in series, then the applied voltage required during a voltage stress test for each is reduced in half. This reduction in the required applied voltage is due to the inherent splitting of voltages between two capacitors connected in series. In order to assure its reliability, each of two capacitors connected in series is, therefore, adequately voltage stress testable at a lesser applied voltage than a single embedded capacitor. For example, if a conventional single embedded capacitor with a capacitance of 1 picofarad requires an applied voltage of 200 volts during a voltage stress test, then the use of a first embedded dual capacitor and a second embedded dual capacitor that are connected in series (each with a capacitance of 2 picofarads to provide an total capacitance of 1 picofarad) reduces the required applied voltage for each capacitor by one half, to 100 volts.

By employing a probe pad electrically connected directly between the first embedded dual capacitor and the second embedded dual capacitor, a voltage stress test can be independently conducted by placing the required applied voltage on each of the first and second embedded dual capacitors. In the absence of the probe pad or if the probe pad is connected to the first and second embedded dual capacitors at a location other than therebetween, a higher test probe voltage would need to be applied to the probe pad itself, thereby exposing other electronic devices in the IC to that voltage, for a given applied voltage actually placed on each of the first and second embedded dual capacitors. Such an employment of a probe pad at a location between the first embedded dual capacitor and the second embedded dual capacitor, therefore, enables conducting an independent voltage stress test of each of the first and second embedded dual capacitors at a sufficiently high applied voltage that assures their reliability, without subjecting other electronic devices in the IC to a damaging level of voltage. For example, if other electronic devices in the IC cannot withstand voltages above 100 volts, each of two equally sized first and second embedded dual capacitors can be independently voltage stress tested using an applied voltage of 100 volts, thereby subjecting the other electronic devices in the IC to only a voltage of at most 100 volts and, hence, avoiding their breakdown. An independent voltage stress test of each of the embedded dual capacitors, using an applied voltage of 100 volts is equivalent to a voltage stress test of a conventional single embedded capacitor of equal capacitance, using an applied voltage of 200 volts. In other words, if only a single conventional embedded capacitor is employed, the total applied voltage permissible to use for its voltage stress test is limited by the maximum allowable voltage that can be applied to other electronic devices in the IC. If, however, a first embedded dual capacitor and a second embedded dual capacitor are connected in series with a probe pad electrically connected directly therebetween, the total applied voltage permitted to use for voltage stress tests for both of them is not limited by the maximum allowable voltage that can be applied to the other electronic devices in the IC.

Also provided is a process for voltage stress testing embedded dual capacitors. The process includes steps of first providing a voltage stress testable embedded dual capacitor structure in accordance with the present invention (as described above), followed by voltage stress testing the first embedded dual capacitor. The voltage stress test step includes inducing a first predetermined electric field, and hence producing a first current flow, across the first embedded dual capacitor by applying a first predetermined test probe voltage to the probe pad, and by measuring the first current flow. Next, the second embedded dual capacitor is voltage stress tested by inducing a second predetermined electric field, and hence producing a second current flow, across the second embedded dual capacitor by applying a second predetermined test probe voltage to the probe pad and by measuring the second current flow.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

In order to provide a clear and consistent understanding of the present invention and claims, the following definitions are hereby provided:

The term "applied voltage" refers to a voltage specifically applied to an embedded capacitor to induce a predetermined electric field therein.

The term "test probe voltage" refers to a voltage specifically applied to a probe pad for the purpose of conducting a voltage stress test.

Figure 1:
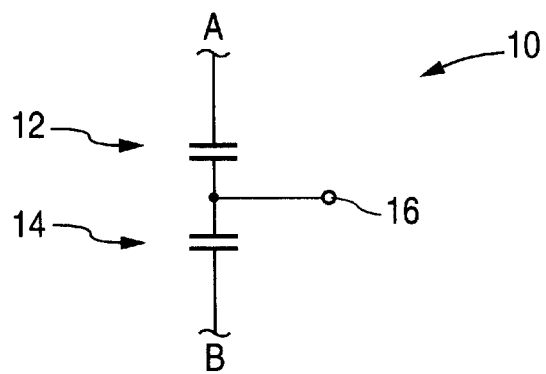
FIG. 1 is an electrical schematic representation of a voltage stress testable embedded dual capacitor structure according to the present invention.

FIG. 1 is an electrical schematic representation of a voltage stress testable embedded dual capacitor structure 10 for use in an integrated circuit (IC) in accordance with the present invention. The voltage stress testable embedded dual capacitor structure 10 includes first embedded dual capacitor 12 and second embedded dual capacitor 14 that are directly electrically connected to each other in series. Voltage stress testable embedded dual capacitor structure 10 also includes a probe pad 16 that is electrically connected directly between the first embedded dual capacitor 12 and the second embedded dual capacitor 14. Voltage stress testable embedded dual capacitor structure 10 is electrically interconnected with electronic devices of an IC (not shown in FIG. 1) at points A and B. The presence of two capacitors, namely the first embedded dual capacitor 12 and the second embedded dual capacitor 14, connected in series and a probe pad 16 electrically connected directly therebetween enables a voltage stress testable embedded dual capacitor structure 10 to be voltage stress tested using a sufficiently high applied voltage to assure the reliability of the first and second embedded dual capacitors, without exposing other electrically interconnected electronic devices in the IC to a damaging level of voltage.

Figure 2:
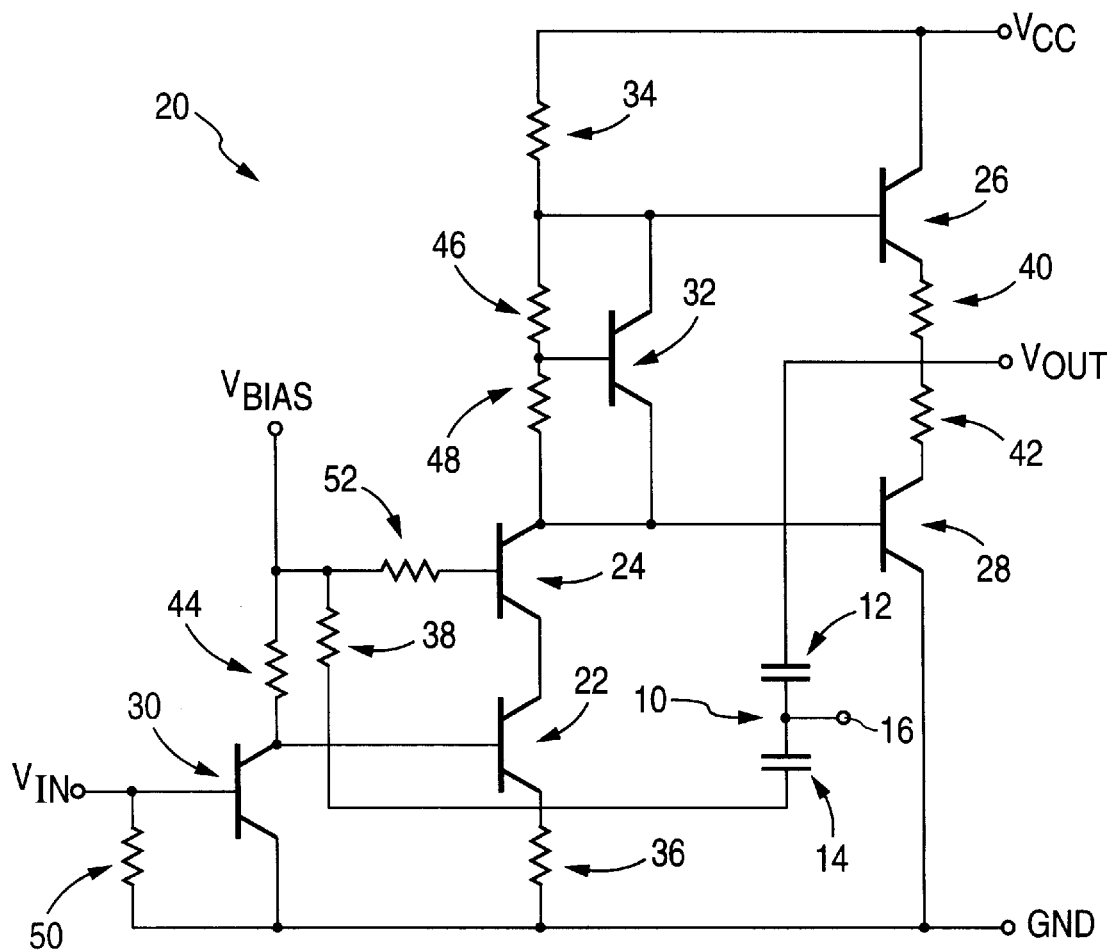
FIG. 2 is a electrical schematic representation of the interconnected electronic devices, including a voltage stress testable embedded dual capacitor structure according to the present invention, incorporated in a portion (i.e. a single "channel") of a CRT driver IC.

FIG. 2 is an electrical schematic representation of a portion (i.e. a single "channel") of a CRT driver IC 20 that includes the voltage stress testable embedded dual capacitor structure 10 of FIG. 1. The portion of the CRT driver IC 20 includes six interconnected bipolar transistors 22, 24, 26, 28, 30 and 32, as well as ten interconnected resistors 34, 36, 38, 40, 42, 44, 46, 48, 50 and 52.

The portion of the CRT driver IC 20 also includes voltage connection nodes for $V_{IN}$, $V_{BIAS}$, $V_{CC}$ and $V_{OUT}$, as well as a connection node to ground (GND). The portion of the CRT driver IC 20 represents one "channel" of a three-channel (i.e. red, green and blue channels) CRT driver IC that is designed to drive a color CRT monitor. Electronic signals for driving the color CRT monitor are generated in the CRT driver IC and supplied to the color CRT monitor via $V_{OUT}$. The interconnection among the six bipolar transistors, ten resistors, a first embedded dual capacitor and a second embedded dual capacitor is such that the CRT driver IC can provide the electronic signals to drive the electron gun of the color CRT monitor.

A typical total capacitance value for the first embedded dual capacitor 12 and the second embedded dual capacitor 14 is in the range of 0.7 picofarads to 4.0 picofarads. The individual capacitance values for the first embedded dual capacitor 12 and the second embedded dual capacitor 14 are preferably, but need not be, identical so that any voltage, the first and second dual embedded capacitors are subjected to during operation of the IC, will be split equally between them. When the first and second dual embedded capacitors are used in a portion of a CRT driver IC (as shown in FIG. 2), their total capacitance value is a factor in establishing the positive feedback, and hence an increased speed, of the CRT driver IC. When voltage stress testable embedded dual capacitor structure 10 is used with a CRT driver IC, voltage stress tests for the first embedded dual capacitor 12 and the second embedded dual capacitor 14 can be independently conducted using probe pad 16 and a predetermined test probe voltage. Such independently conducted voltage stress tests do not subject bipolar transistors 22, 24, 26, 28, 30 and 32 to a damaging level of voltage.

Figure 3:
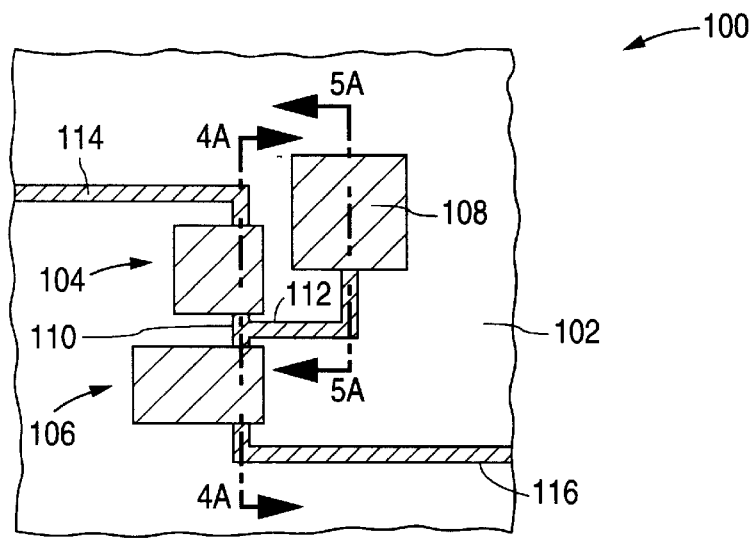
FIG. 3 is a top layout view (not to scale) of a voltage stress testable embedded dual capacitor structure in accordance with the present invention.
Figure 4:
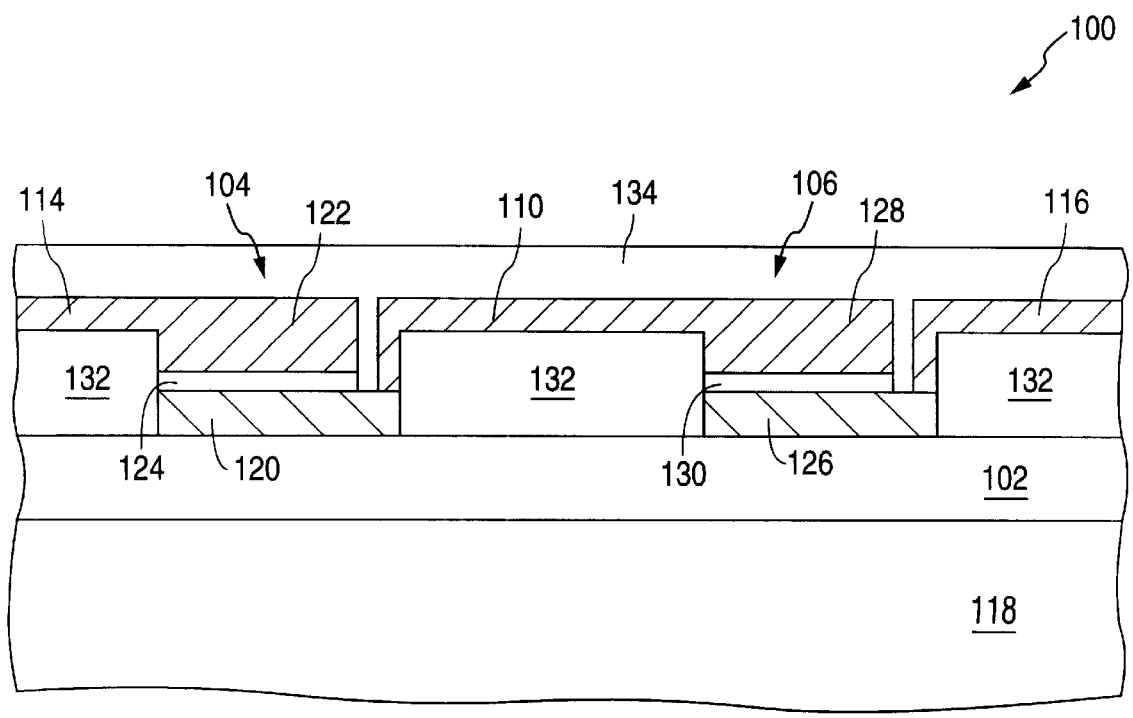
FIG. 4 is a cross-sectional view of the voltage stress testable embedded dual capacitor structure of FIG. 3, taken along line 4A—4A of FIG. 3.
Figure 5:
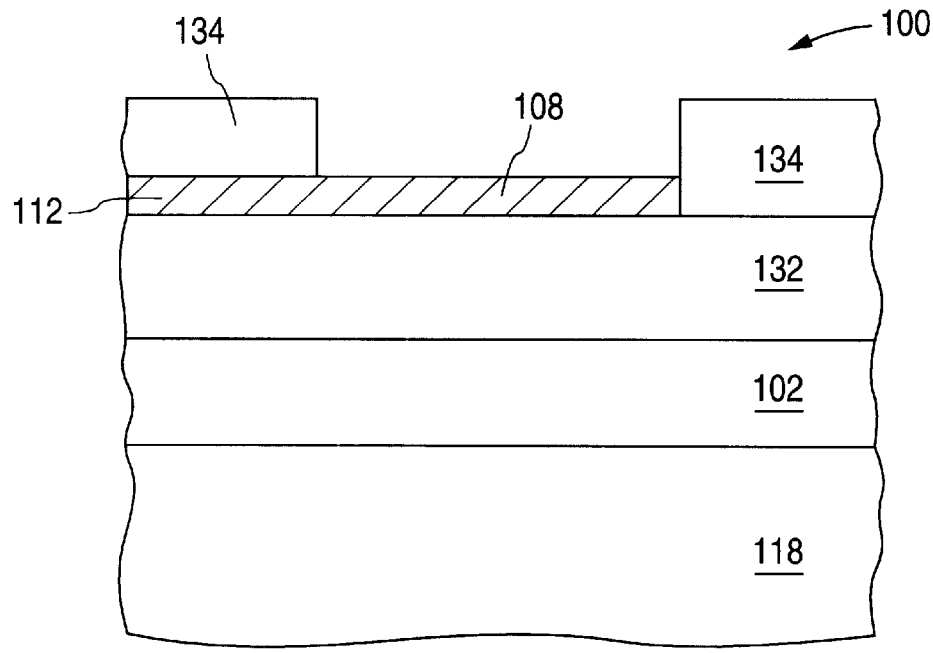
FIG. 5 is a cross-sectional view of the voltage stress testable embedded dual capacitor structure of FIG. 3, taken along line 5A—5A of FIG. 3.

FIGS. 3–5 illustrate, in layout and cross-sectional views, an exemplary voltage stress testable embedded dual capacitor structure according to the present invention. Voltage stress testable embedded dual capacitor structures in accordance with the present invention enable first and second embedded dual capacitors therein to undergo a voltage stress test using an applied voltage high enough to guarantee their reliability, without exposing other electronic devices in the IC to a damaging level of voltage. First, by connecting a first embedded dual capacitor in series with a second embedded dual capacitor, the applied voltage required during a voltage stress test for each of the embedded dual capacitors can be reduced due to the inherent splitting of voltages between two capacitors connected in series. Each of two capacitors connected in series can, therefore, be adequately voltage stress tested, for assurance of its reliability, at a lesser applied voltage than, for example, a single embedded capacitor. Second, by electrically connecting a probe pad directly between the first embedded dual capacitor and the second embedded dual capacitor, a voltage stress test can be independently conducted by placing the required applied voltage on each of the first and second embedded dual capacitors. Third, by electrically connecting a probe pad at a location between the first and second embedded dual capacitors, a lower test probe voltage needs to be applied to the probe pad, thereby avoiding the exposure of other electronic devices in the IC to a damaging level of voltage, for a given applied voltage actually placed on each of the first and second embedded dual capacitors.

In other words, voltage stress testable embedded dual capacitor structures in accordance with the present invention enable, by employing first and second embedded dual capacitor connected in series with a probe pad electrically connected directly therebetween, conducting voltage stress tests using a total applied voltage (i.e. applied voltage for both first and second embedded dual capacitor) that is higher than the maximum allowable voltage that can be applied to the other electronic devices in the IC. Voltage stress testable embedded dual capacitor structures according to the present invention, therefore, enable conducting voltage stress tests at a sufficiently high applied voltage to completely assure reliability of their first and second embedded dual capacitors. In addition, the voltage stress testable embedded dual capacitor structure can be manufactured using conventional semiconductor fabrication techniques (e.g. sequential layer depositions, followed by patterning of the deposited layers using photolithography and etching) well known to those of skill in the art.

A voltage stress testable embedded dual capacitor structure 100 in accordance with the present invention, as illustrated in FIG. 3, includes a semiconductor substrate (not shown) with an electrically insulating base layer 102 thereon. The voltage stress testable embedded dual capacitor structure 100 also includes a first embedded dual capacitor 104, a second embedded dual capacitor 106 and a probe pad 108. The first embedded dual capacitor 104 and the second embedded dual capacitor 106 are electrically connected directly to each other in series by a metal line 110. The probe pad 108 is electrically connected directly between the first embedded dual capacitor 104 and the second embedded dual capacitors 106 via metal lines 110 and 112. The voltage stress testable embedded dual capacitor structure 100 is electrically interconnected with other electronic devices of an IC via metal lines 114 and 116. When voltage stress testable embedded dual capacitor structure 100 is, for example, used with a CRT driver IC, metal line 114 can be connected to a $V_{OUT}$ voltage connection node, while metal line 116 can be connected to a connection node to ground.

FIGS. 4 and 5 illustrate cross-sectional views of the voltage stress testable embedded dual capacitor structure 100 of FIG. 3, taken along lines 4A—4A and 5A—5A, respectively. The voltage stress testable embedded dual capacitor structure 100 includes a semiconductor substrate (e.g. a silicon substrate) 118 with an electrically insulating base layer 102 thereon. The electrically nsulating base layer 102 can be formed of, for example, silicon dioxide ($SiO_2$) or other electrically insulating material known in the field. The voltage stress testable embedded dual capacitor structure 100 also includes a first embedded dual capacitor 104 and a second embedded dual capacitor 106, both disposed on the electrically insulating base layer 102. Also included in the first embedded dual capacitor 104 are an electrically conductive bottom plate 120 and an electrically conductive top plate 122, separated by a dielectric material layer 124. The second embedded dual capacitor 106 includes an electrically conductive bottom plate 126 and an electrically conductive top plate 128, separated by a dielectric material layer 130. The first embedded dual capacitor 104 and the second embedded dual capacitor are connected in series by a metal line 110, which serves as a direct electrical connection between the electrically conductive bottom plate 120 of the first embedded dual capacitor 104 and the electrically conductive top plate 128 of the second embedded dual capacitor 106.

The voltage stress testable embedded dual capacitor structure 100 also includes an isolation layer 132 disposed on the electrically insulating base layer 102 and a probe pad 108 disposed on the isolation layer 132. The isolation layer 132 physically, as well as electrically (except via the metal line 110), separates the first embedded dual capacitor 104 from the second embedded dual capacitor 106. The isolation layer 132 is typically formed of $SiO_2$. Also included in the voltage stress testable embedded dual capacitor structure 100 is a passivation layer 134 (e.g. typically formed of $SiO_2$ or $Si_3N_4$), which covers electrically conductive top plates 122 and 128, as well as metal lines 110, 112, 114 and 116. Passivation layer 134 does not cover the probe pad 108 since the probe pad 108 must be physically accessible to a tester probe.

Probe pad 108 is generally square-shaped and formed of aluminum or other metal (e.g. a TiW and aluminum stack). A typical size of the probe pad 108 is in the range of 2 mil by 2 mil (i.e. approximately 51 microns by 51 microns) to 4 mil by 4 mil (i.e. approximately 102 microns by 102 microns), while its typical thickness is in the range of 11,000 angstroms to 16,000 angstroms. The size of the probe pad 108 should be as large as possible so that a tester probe an easily make contact with the probe pad 108 during a voltage stress test.

However, as the size of the probe pad increases, the stray capacitance, created by the presence of the probe pad 108

(along with adjacent layers made out of dielectric material and nearby layers made out of conductive material), also increases. The optimum probe pad size should be selected by balancing the need for a large probe pad easily accessible to a tester probe and the need for a small probe pad with minimal stray capacitance. If the presence of the probe pad 108 creates a significant stray capacitance, the capacitance values of the first embedded dual capacitor 104 and the second embedded dual capacitor 106 can be adjusted accordingly to compensate for the stray capacitance. The probe pad 108 is preferably located as close as possible to the first embedded dual capacitor 104 and the second embedded dual capacitor 106, in order to minimize the length of metal line 112, and hence the stray capacitance created thereby.

The electrically conductive bottom plates 120 and 126, although generally formed of doped polysilicon, can be formed of any electrically conductive materials known in the field, such as metals. A typical thickness for the electrically conductive bottom plates 120 and 126 is in the range of 3200 angstroms to 3800 angstroms. The electrically conductive top plates 122 and 128, although generally formed of metal (e.g. a metal stack including 1500 angstroms of TiW and 12,000 angstroms of aluminum), can be formed of any electrically conductive materials known in the field. A typical thickness for the electrically conductive top plates 122 and 128 is in the range of 11,000 angstroms to 16,000 angstroms.

The dielectric material layers 124 and 130 can be formed of any dielectric material known in the field, such as $SiO_2$ layers formed by the decomposition of tetraethylorthosilicate (TEOS, $Si[OC_2H_5]_4$). A typical thickness for the dielectric material layers 124 and 130 is in the range of 2000 to 2500 angstroms. Metal lines 110, 112, 114 and 116 are typically 6 microns in width and can be formed of the same material as the probe pad 108 and electrically conductive top plates 122 and 128. The electrically conductive bottom plates 120 and 126, the electrically conductive top plates 122 and 128 and the dielectric material layers 124 and 130 are conventionally formed by patterning blanket layers of the appropriate material (e.g. doped polysilicon, metal and $SiO_2$, respectively).

Such blanket layers can also be used to form portions of other electronic devices in the IC. For example, a metal layer used to form the electrically conductive top plates 122 and 128 can also be used to form metal interconnect lines between transistors.

Figure 6:
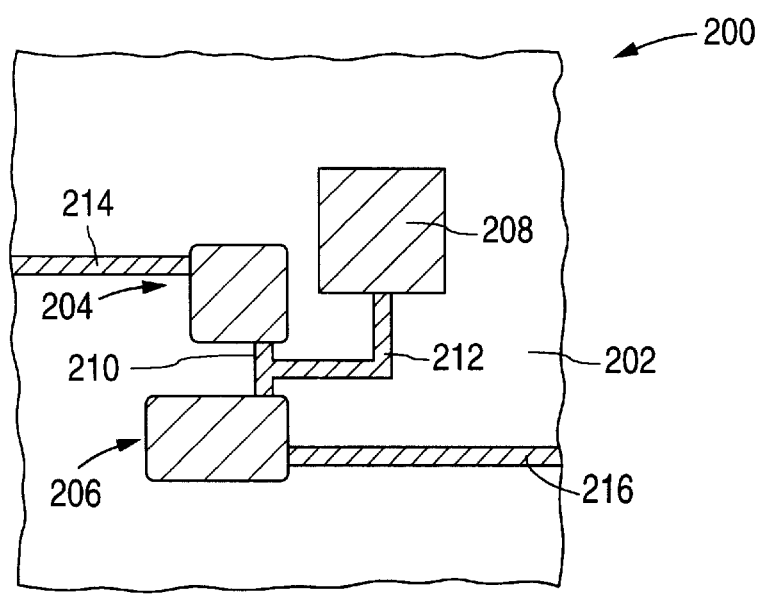
FIG. 6 is a top layout view (not to scale) of another embodiment of a voltage stress testable embedded dual capacitor structure in accordance with the present invention that includes first and second embedded dual capacitors with rounded corners.

In one embodiment of the present invention, a voltage stress testable embedded dual capacitor structure 200, as illustrated in FIG. 6, includes a semiconductor substrate (not shown) with an electrically insulating base layer 202 thereon. The voltage stress testable embedded dual capacitor structure 200 also includes a first embedded dual capacitor 204, a second embedded dual capacitor 206 and a probe pad 208. The comers of the first embedded dual capacitor 204 and the second embedded dual capacitor 206 are rounded to reduce voltage stress concentration effects (e.g. premature capacitor breakdown upon a voltage stress test) that are present at sharp capacitor corners. The degree of comer rounding depends on the size of the first and second embedded dual capacitors. A typical rounded comer would, however, have a radius in the range of 0.5 microns to 2 microns. The first embedded dual capacitor 204 and the second embedded dual capacitor 206 are electrically connected directly to each other in series by a metal line 210. The probe pad 208 is electrically connected directly between the first embedded dual capacitor 204 and the second embedded dual capacitor 206 via metal lines 210 and 212. The voltage stress testable embedded dual capacitor structure 200 is electrically interconnected with other electronic devices in an IC via metal lines 214 and 216. When the voltage stress testable embedded dual capacitor structure 200 is used with a CRT driver IC, the metal line 214 can be connected to a $V_{OUT}$ voltage connection node, while metal line 216 can be connected to a connection note to ground.

A process for testing voltage stress testable embedded dual capacitor structure in accordance with the present invention includes steps of first providing a voltage stress testable embedded dual capacitor structure, as described above, for use in an IC, followed by voltage stress testing the first embedded dual capacitor. This voltage stress testing step includes inducing a first predetermined electric field, and hence producing a first current flow, across the first embedded dual capacitor by applying a first predetermined test probe voltage to the probe pad, and by measuring the first current flow. Next, the second embedded dual capacitor is voltage stress tested by inducing a second predetermined electric field, and hence producing a second current flow, across the second embedded dual capacitor by applying a second predetermined test probe voltage tot he probe pad and by measuring the second current flow.

The first predetermined test probe voltage and the second predetermined test probe voltage used in processes in accordance with the present invention are selected based on the capacitance values and dielectric material layer thicknesses of the first embedded dual capacitor and the second embedded dual capacitor, respectively. In addition, the reliability of the first and second embedded dual capacitors can be determined by comparing the first and second current flows to predetermined current limits. The ICs with either first or second current flow greater than the predetermined current limits can be rejected as unreliable, while the ICs with both first and second current flows less than the predetermined current limits can be acceptable for shipment to customers. The presence the second embedded dual capacitor in combination with the presence of the probe pad connected between the first embedded dual capacitor and the second embedded dual capacitor helps to isolate the other electronic devices in the IC from the first predetermined test probe voltage during the voltage stress testing step of the first embedded dual capacitor. Similarly, the presence the first embedded dual capacitor in combination with the presence of the probe pad connected between the first embedded dual capacitor and the second embedded dual capacitor helps to isolate the other electronic devices in the IC from the second predetermined test probe voltage during the voltage stress testing step of the second embedded dual capacitor. A process in accordance with the present invention can be used to voltage stress test a voltage stress testable embedded capacitor structure used in a portion of a CRT driver IC 20 (as illustrated in FIG. 2). For a CRT driver IC 20 wherein each of the first embedded dual capacitor 12 and the second embedded dual capacitor 14 has a capacitance value of 2 picofarads, and the resistor 36 has a resistance value of 100 ohms, the first predetermined test probe voltage and the second predetermined test probe voltage are equal (e.g. in the range of 100 volts to 140 volts) to each other and are applied to the probe pad for approximately 100 milliseconds. During the voltage stress testing step of the first embedded dual capacitor 12, $V_{OUT}$ is connected to ground. The first embedded dual capacitor 12 and the second embedded dual capacitor 14 are discharged immediately after measuring the first current flow and the second current flow, respectively, in order to avoid overstressing the IC during its operation. This process can be conducted using, for example, a Tektronix Model 576 curve tracer.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A voltage stress testable embedded dual capacitor structure for use in an integrated circuit (IC), the voltage stress testable embedded dual capacitor structure comprising:
    a semiconductor substrate with an electrically insulating base layer disposed thereon;
    a first embedded capacitor and a second embedded capacitor disposed on the electrically insulating base layer, the first and second embedded capacitors electrically connected directly to each other in series and electrically connected to electronic devices in the IC; and
    a probe pad electrically connected directly between the first embedded capacitor and the second embedded capacitor,
    whereby the first embedded capacitor and the second embedded capacitor can be independently voltage stress tested without subjecting the electronic devices in the IC to a damaging level of voltage.

2. The voltage stress testable embedded dual capacitor structure of claim 1, wherein each of the first embedded capacitor and the second embedded capacitor includes:
    an electrically conductive bottom plate disposed on the electrically insulating base layer;
    an electrically conductive top plate; and
    a dielectric material layer separating the electrically conductive top plate from the electrically conductive bottom plate.

3. The voltage stress testable embedded dual capacitor structure of claim 2, wherein the probe pad is electrically connected directly to the electrically conductive top plate of the second embedded capacitor and electrically connected directly to the electrically conductive bottom plate of the first embedded capacitor.

4. The voltage stress testable embedded dual capacitor structure of claim 2, wherein the first embedded capacitor and the second embedded capacitor are electrically connected directly to each other in series via an electrical connection between the electrically conductive bottom plate of the first embedded capacitor and the electrically conductive top plate of the second embedded capacitor.

5. The voltage stress testable embedded dual capacitor structure of claim 2, wherein the electrically conductive bottom plate and the electrically conductive top plate of the first embedded capacitor are square-shaped with rounded corners.

6. The voltage stress testable embedded dual capacitor structure of claim 2, wherein the electrically conductive bottom plate and the electrically conductive top plate of the second embedded capacitor are square-shaped with rounded corners.

7. The voltage stress testable embedded dual capacitor structure of claim 1, wherein the total capacitance of the first embedded capacitor and the second embedded capacitor is in the range of 0.7 picofarads to 4.0 picofarads.

8. The voltage stress testable embedded dual capacitor structure of claim 2, wherein the electrically conductive bottom plates of the first embedded capacitor and the second embedded capacitor are formed of doped polysilicon.

9. The voltage stress testable embedded dual capacitor structure of claim 2, wherein the electrically conductive top plates of the first embedded capacitor and the second embedded capacitor are formed of metal.

10. The voltage stress testable embedded dual capacitor structure of claim 2, wherein the dielectric material layers of the first embedded capacitor and the second embedded capacitor are formed of $SiO_2$.

11. The voltage stress testable embedded dual capacitor structure of claim 1, wherein the first embedded capacitor and the second embedded capacitor are electrically connected to electronic devices in a CRT driver IC.

12. The voltage stress testable embedded dual capacitor structure of claim 11, wherein the first embedded capacitor is electrically connected directly to a voltage connection node of the CRT driver IC.

13. A method for voltage stress testing a voltage stress testable embedded dual capacitor structure comprising the steps of:
    providing a voltage stress testable embedded dual capacitor structure for use in an integrated circuit (IC), the voltage stress testable embedded dual capacitor structure comprising:
        a semiconductor substrate with an electrically insulating base layer disposed thereon;
        a first embedded capacitor and a second embedded capacitor disposed on the electrically insulating base layer, the first embedded capacitor and the second embedded capacitor electrically connected directly to each other in series and electrically connected to electronic devices in the IC; and
        a probe pad electrically connected directly between the first embedded capacitor and the second embedded capacitor;
    voltage stress testing the first embedded capacitor by inducing a first predetermined electric field across the first embedded capacitor by applying a first predetermined test probe voltage to the probe pad, while measuring a first current flow across the first embedded capacitor; and
    voltage stress testing the second embedded capacitor by inducing a second predetermined electric field across the second embedded capacitor by applying a second predetermined test probe voltage to the probe pad, while measuring a second current flow across the second embedded capacitor.

14. The method of claim 13 further including the steps of:
    discharging the first embedded capacitor after the step of voltage stress testing the first embedded capacitor; and
    discharging the second embedded capacitor after the step of voltage stress testing the second embedded capacitor.

15. The method of claim 13, wherein the step of voltage stress testing the first embedded capacitor and the step of voltage stress testing the second embedded capacitor include applying a first predetermined test probe voltage and applying a second predetermined test probe voltage, respectively, the total of the first predetermined test probe voltage and the second predetermined test probe voltage being greater than a damaging level of voltage for the electronic devices in the IC.

16. The method of claim 13, wherein the step of voltage stress testing the first embedded capacitor and the step of voltage stress testing the second embedded capacitor include applying a first predetermined test probe voltage and applying a second predetermined test probe voltage, respectively, the first predetermined test probe voltage and the second predetermined test probe voltage being equal.

* * * * *